(12) United States Patent
Okazaki et al.

(10) Patent No.: US 6,352,801 B1
(45) Date of Patent: Mar. 5, 2002

(54) PHASE SHIFT MASK AND MAKING PROCESS

(75) Inventors: Satoshi Okazaki; Hideo Kaneko; Tamotsu Maruyama; Yukio Inazuki, all of Nakakubiki-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/573,560

(22) Filed: May 19, 2000

(30) Foreign Application Priority Data

May 20, 1999 (JP) .......................................... 11-139597

(51) Int. Cl.$^7$ ................................................. G03F 9/00
(52) U.S. Cl. ............................................................ 430/5
(58) Field of Search ........................ 430/5, 322; 716/19, 716/20, 21; 250/492.22

(56) References Cited

FOREIGN PATENT DOCUMENTS

JP         10312200      *  5/2000

* cited by examiner

Primary Examiner—S. Rosasco
(74) Attorney, Agent, or Firm—Millen, White, Zelano & Branigan, P.C.

(57) ABSTRACT

A phase shift mask has a phase shifter formed on a substrate which is transmissive to exposure light. The phase shifter serving as a second light transmissive region is constructed of gadolinium gallium garnet. The shifter film formed under the sputtering conditions capable of restraining the generation of particles causing film defects is homogeneous, and the phase shift mask is of high precision.

13 Claims, 2 Drawing Sheets

FIG.1
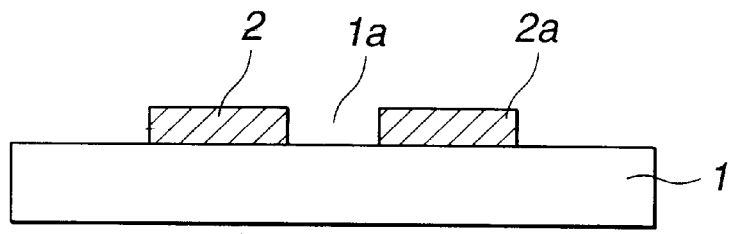
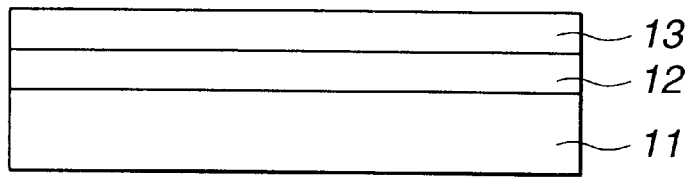
FIG.2A
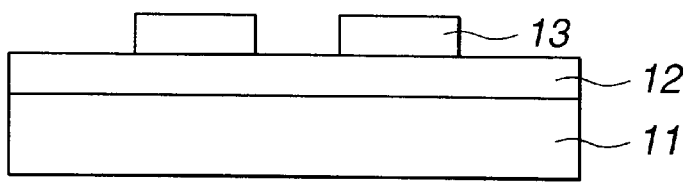
FIG.2B
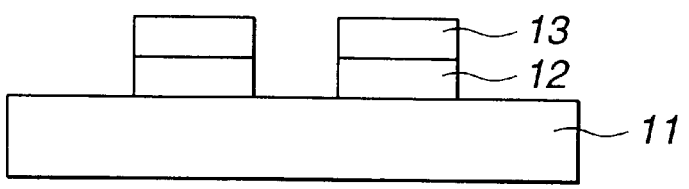
FIG.2C
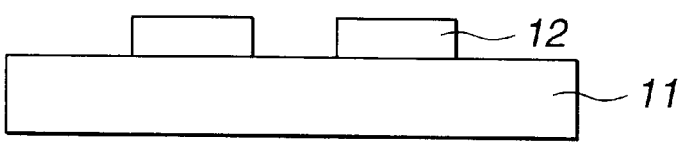
FIG.2D

PHASE SHIFT MASK AND MAKING PROCESS

This invention relates to a phase shift mask, especially a halftone phase shift mask, and a process for preparing the same.

BACKGROUND OF THE INVENTION

It is now required to achieve a finer pattern rule in the drive for higher integration and operating speeds in LSI devices. The photo mask used in the pattern formation is also required to be of finer definition. A number of phase shift masks have been developed to meet the demand. Among others, halftone phase shift masks which are relatively easy to prepare are utilized in practice. Referring to FIG. 4, the principle of the halftone phase shift mask is described. A shifter 42 for shifting light phase is formed on a quartz substrate 41. When light is transmitted by this structure, interference occurs between the light transmitted by the shifter 42 and having phase shifted and the light transmitted by only the substrate and having the original phase. Resolving power is improved by utilizing this interference. The phase should be shifted accurately 180 degrees. In the manufacture of the mask, it is necessary to minimize the generation of particles and defects. If the size of particles or defects is approximate to the micro mask pattern, a pattern associated with defects can be added to the desired mask pattern, lowering the yield of mask formation. This eventually lowers the yield of semiconductor circuit fabrication.

In the prior art, molybdenum silicide materials are practically used as the shifter material for halftone phase shift masks. However, they have the following drawbacks.

The molybdenum silicide material of which the shifter film of conventional halftone phase shift masks is formed is very difficult to deposit as a film. This leads to a marked decline of manufacturing yield at the stage of photomask blanks prior to the stage of completed masks.

While there are speculated several causes of this problem, the predominant causes are (1) reactive sputtering and (2) a relatively low target density.

(1) Reactive sputtering

In forming the MoSi shifter material, a sintered body of Mo and Si represented by MoSix wherein x is 2 to 3 is most often used as the target. Upon sputtering, a large volume of oxygen, nitrogen or methane is fed as the reactive gas. However, since these gases are highly reactive, gas components can be taken in the film being deposited before the gas reaches the center of the target. As a result, a significant difference of quality is introduced in the film in a direction toward the target center. This film quality difference appearing as a film quality distribution of shifter material invites a significant change of refractive index. In addition, particles can grow in the vapor phase within the plasma, resulting in the shifter film having many defects.

The generation of particles and defects can be suppressed by reducing the flow rate of the reactive gas. However, if the flow rate of the reactive gas is excessively reduced, the transmittance of the film cannot be increased to the desired level.

(2) Relatively low target density

The other drawback of the prior art MoSi halftone phase shift mask is that the target in the form of a sintered body of molybdenum metal and silicon metal cannot be fully consolidated and becomes a bulky target having a lower density than the desired level. When such a target having a low density is sputtered, there often generate particles and defects. Additionally, the target surface is susceptible to corrosion and oxidation by the reactive gas, with the increased tendency of generating defects.

While these problems are considered from the standpoint of defects in the shifter film, the prior art phase shift mask has another serious problem associated with an uneven distribution of film quality.

The reason is that the reactive sputtering requires to take many components from the reactive gas into the film. The uneven distribution of film quality suggests that the phase shift angle expressed by the following formula (1) has a distribution within the mask substrate. It is then quite difficult to form a phase shift mask with a high precision.

$$D = \lambda/2(n-1) \tag{1}$$

Herein D is the thickness of a shifter film for 180 degree phase shift, n is the refractive index of the shifter material, and λ is a transmission wavelength.

As mentioned above, the prior art process of depositing the shifter material in film form entails the generation of particles causing film defects. It is very difficult to deposit a defect-free shifter film.

Furthermore, the reactive sputtering uses a large volume of reactive gas which causes the generation of particles. Since the manner of taking in the reactive gas is variant in a direction toward the center of the target, it is difficult to control the process so as to form a homogeneous film over the entire substrate surface. It is also a problem from the standpoints of defect prevention and film quality uniformity that the target material is limited to a sintered body of MoSi.

SUMMARY OF THE INVENTION

An object of the invention is to provide a phase shift mask which has solved the above-mentioned problems of the prior art halftone phase shift masks and complies with the drive for miniaturization and higher integration in semiconductor integrated circuits. Another object is to provide a process for preparing the phase shift mask.

It has been found that a phase shifter film formed of gadolinium gallium garnet is effective to the above object, and that the gadolinium gallium garnet film can be effectively formed by sputtering an oxide single crystal of gadolinium gallium garnet.

In a first aspect, the invention provides a phase shift mask comprising a phase shifter formed on a substrate which is transmissive to exposure light. The area of the substrate which is not covered with the phase shifter serves as a first light transmissive region and the phase shifter serves as a second light transmissive region. The phase shifter is constructed of gadolinium gallium garnet. Preferably, the phase shifter shifts the phase of transmitted exposure light by 180±5° and has a transmittance of 3 to 30%.

In a second aspect, the invention provides a process for preparing a phase shift mask comprising the steps of forming a film of gadolinium gallium garnet on a substrate which is transmissive to exposure light, by sputtering; forming a resist pattern on the gadolinium gallium garnet film; and dry etching the gadolinium gallium garnet film through the resist pattern to pattern the gadolinium gallium garnet film. Preferably, the sputtering step uses an oxide single crystal of gadolinium gallium garnet as the target. Also preferably, the sputtering step is reactive sputtering using a mixture of an inert gas with an element source gas selected from among oxygen, nitrogen and carbon. More preferably the element source gas is selected so as to provide a flow rate of 1 to 25% of oxygen, 2 to 20% of nitrogen or 2 to 15% of carbon, based on the flow rate of the inert gas.

To produce the phase shifter material, according to the invention, sputtering is carried out using an oxide single crystal whose composition is uniform on the atomic level as the target material rather than the bulky sintered body, typically of MoSi, used in the prior art. The sputtering of the oxide single crystal minimizes the generation of particles from the target and enables to form a homogeneous film over the entire substrate surface. Since the target composition contains a quantitative amount of oxygen, the oxygen component to be taken into the sputtered film from the reactive gas is limited. Then the reactive gas may be fed in a small amount just necessary for the fine adjustment of a transmittance and a phase shift angle. This permits easy control of the composition of the shifter material and minimizes the growth of particles in the vapor phase within the plasma, ensuring that a shifter film is formed defect-free.

As understood from formula (1), the gadolinium gallium garnet film provides a 180 degree phase shift of transmitted light at a relatively small thickness since it has a high refractive index. This minimizes the influence (mainly on focal depth) of the shifter film thickness upon exposure.

BRIEF DESCRIPTION OF THE DRAWINGS

FIG. 1 is a cross-sectional view of a phase shift mask according to one embodiment of the invention.

FIG. 2 illustrates a process for preparing a phase shift mask according to the invention, FIG. 2(A) showing the formation of a resist film, FIG. 2(B) showing patterning of the resist film, FIG. 2(C) showing dry etching, and FIG. 2(D) showing a structure left after removal of the resist film.

DESCRIPTION OF THE PREFERRED EMBODIMENT

Figure 3:
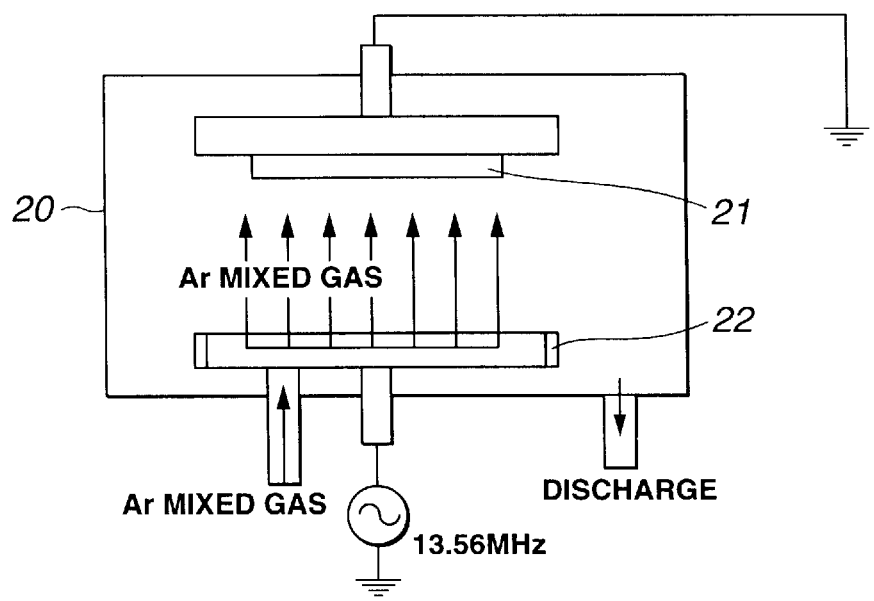
FIG. 3 is a schematic illustration of an RF sputtering system used in Example.
Figure 4A:
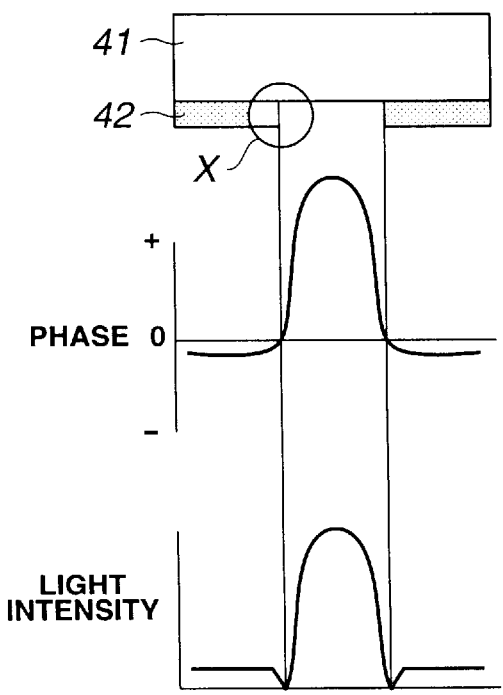
FIG. 4(A) illustrates the principle of a halftone phase shift mask.
Figure 4B:
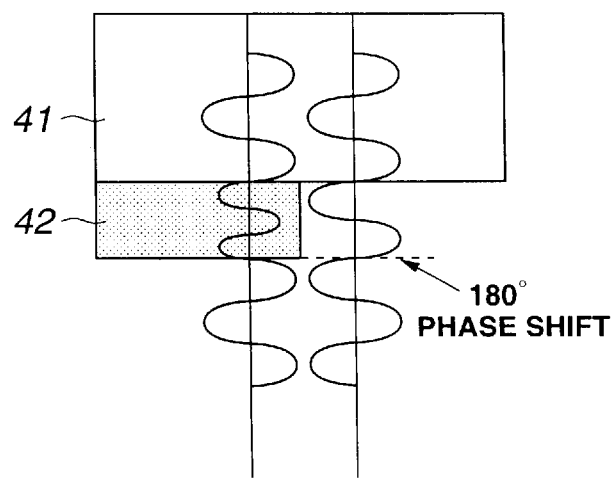
FIG. 4(B) is an enlarged view of circle X in FIG. 4(A).

As shown in FIG. 1, the phase shift mask of the invention includes a substrate 1 of quartz, $CaF_2$, etc. which is transmissive to exposure light, and a patterned shifter film 2 on the substrate 1. The space between the shifter film segments becomes a first light transmissive region 1a, and each shifter film segment 2 becomes a second light transmissive region. According to the invention, the shifter serving as the second light transmissive region is constructed of gadolinium gallium garnet and preferably to such a thickness as to provide a phase difference of 180±5° and a transmittance of 3 to 30%.

The gadolinium gallium garnet film of the phase shift mask can be formed by sputtering. An oxide single crystal of gadolinium gallium garnet is preferably used as the target for sputtering. Gadolinium gallium garnet is used as the target material for the following reason. Since it has a relatively high index of refraction, reactive sputtering can be effected so as to provide a desired transmittance to light of 248 nm, 193 nm and 157 nm. Since the oxide single crystal is a closely consolidated target material, even sputtering in a reactive gas stream generates few particles and introduces few defects into the film being deposited.

The sputtering technique used herein is not critical and may use either a DC power supply or a high frequency power supply. A magnetron sputtering technique is also useful. Since the target is insulating, an RF magnetron sputtering technique is advantageous.

The sputtering gas used herein may be an inert gas such as argon or xenon. Preferably reactive sputtering is carried out using a mixture of an inert gas with any reactive gas becoming a source of oxygen, nitrogen or carbon, for example, oxygen gas, nitrogen gas, methane gas, carbon monoxide gas or carbon dioxide gas. The reason why reactive sputtering is carried out by flowing the reactive gas is that the film can be given physical properties optimum as the shifter material by changing the refractive index and transmittance of gadolinium gallium garnet. Even in the case of reactive sputtering, since the target already contains a quantitative amount of oxygen atoms therein, it is unnecessary to flow a large volume of the reactive gas. The reactive gas may be fed merely in an effective flow rate to ameliorate the film quality. Then the uniformity of film quality toward the target center is not affected. As compared with the MoSi halftone masks involving film deposition from a MoSi target by reactive sputtering, the proportion of reactive gas is so small that the generation of particles is suppressed.

When it is desired to finely adjust the optical transmittance and refractive index of a phase shifter film formed by sputtering an oxide single crystal of gadolinium gallium garnet as the target, reactive sputtering is carried out using Ar sputtering gas in admixture with an oxygen, nitrogen or carbon source gas such as oxygen, nitrogen, methane, nitrous oxide, carbon monoxide, or carbon dioxide gas. These reactive gases may be selectively used for a particular purpose. The film properties can be adjusted as desired, for example, by introducing oxygen or nitrogen gas when an optical transmittance is necessary, or by introducing a carbon component when it is desired to reduce the optical transmittance.

By changing the proportion of the element source gas, the refractive index can be changed over a wide range of about 2.0 to 2.6. Such a change of refractive index leads to a change of phase shift angle even at the same film thickness, enabling fine adjustment of a phase shift.

The element source gas may be used so as to provide a flow rate of 1 to 25% of oxygen, 2 to 20% of nitrogen or 2 to 15% of carbon, based on the flow rate of the inert gas. This range of flow rate is relatively small as the amount of gas used in reactive sputtering, but effective for changing the refractive index of the shifter film.

The shifter film is deposited to the thickness D given by the formula (1):

$$D = \lambda/2(n-1) \tag{1}$$

wherein D is the thickness of a shifter film for 180 degree phase shift, n is the refractive index of the shifter material, and λ is a transmission wavelength. The gadolinium gallium garnet film has a refractive index of about 2.6. In the event of n=2.60, the desired film thickness varies with the wavelength λ of a light source used. The desired film thickness achieving a phase shift angle of 180° is shown in Table 1.

TABLE 1

Shifter material film thickness achieving a phase shift
angle of 180° to light from different light sources
(refractive index n = 2.6)

| Light source | Wavelength λ | Desired film thickness (Å) |
|---|---|---|
| KrF | 248 nm | 775 Å |
| ArF | 193 nm | 603 Å |
| $F_2$ | 157 nm | 491 Å |

In fact, since the refractive index decreases with a shorter wavelength, the film thickness must generally be greater than the indicated values. Also it is desired to deposit a film uniformly at the desired thickness because the actual film thickness slightly varies with a distribution within the substrate surface if any. A great attention is desirably paid to the distributions of film quality and thickness since the permissible variation of phase angle for the phase shift mask is generally within 180±5°.

The shifter film for the phase shift mask need to have an optical transmittance (of about 5%) at a level not exceeding the exposure threshold of the resist. It is thus desired to adjust the shift film to a material having a transmittance of about 5% to various wavelengths. In this event, the transmittance can be adjusted by admixing an oxygen, nitrogen or carbon source gas during sputtering. For example, if the transmittance is short relative to a selected wavelength, the proportion of oxygen and nitrogen components is increased so that more oxygen and nitrogen components may be taken into the sputtered film. Inversely, if the transmittance is too high relative to a selected wavelength, the proportion of methane or similar gas component is increased so that more carbon component may be taken into the sputtered film.

A transmittance of about 5% is appropriate as mentioned above. The shifter material is useful as long as its transmittance is in the range of about 3 to 30%, which does not exceed the exposure threshold of the resist in many cases.

In preparing the phase shift mask of the invention, as shown in FIG. 2(A), a gadolinium gallium garnet film 12 is first formed on a substrate 11 by sputtering, and a resist film 13 is then formed thereon. The resist film 13 is patterned as shown in FIG. 2(B). Through the resist pattern 13, the gadolinium gallium garnet film 12 is dry etched as shown in FIG. 2(C). Finally the resist film 13 is removed, leaving the substrate 11 having the patterned gadolinium gallium garnet film 12 thereon as shown in FIG. 2(D). The coating of the resist film, patterning (exposure and development), dry etching, and removal of the resist film may be effected by well-known techniques.

EXAMPLE

Examples of the invention are given below by way of illustration and not by way of limitation.

Example 1

Using an RF sputtering system as shown in FIG. 3, a gadolinium gallium garnet film was deposited on a quartz substrate. The RF sputtering system shown in FIG. 3 includes an RF sputtering chamber 20, a quartz substrate 21, and a target 22 opposed to the substrate 21. The target used herein was a gadolinium gallium garnet single crystal. The sputtering gas used herein was a mixture of 30 sccm of argon and 1 sccm of methane as the reactive gas. The gas mixture (Ar mixed gas) was fed in a shower fashion as shown in FIG. 3. By reactive sputtering, a shifter film of 825 Å thick was obtained.

The sputtering conditions are shown in Table 2 and the properties of the film are shown in Table 3. The TS distance is the distance between the target and the substrate.

TABLE 2

| | Sputtering gas | Reactive gas | Power density | Substrate temperature | Sputtering pressure | TS distance |
|---|---|---|---|---|---|---|
| Example 1 | Ar 30 sccm | $CH_4$ 1 sccm | 10 W/cm² | 130° C. | 0.3 Pa | 50 mm |

TABLE 3

| | Film thickness | Refractive index | | Transmittance | |
|---|---|---|---|---|---|
| | | 248 nm | 193 nm | 248 nm | 193 nm |
| Example 1 | 825 Å | 2.51 | 2.23 | 8% | 3% |

Note that the film thickness, refractive index and transmittance were measured by spectral ellipsometer GESP-5 by Sorpra Co.

Examples 2 to 4

Shifter films were formed as in Example 1 except that the sputtering conditions were as shown in Table 4. The properties of the films are shown in Table 5.

TABLE 4

| | Sputtering gas | Reactive gas | | | Power density | Substrate temperature | Sputtering pressure | TS distance |
|---|---|---|---|---|---|---|---|---|
| | Ar | $CH_4$ | $O_2$ | $N_2$ | | | | |
| Example 2 | 30 sccm | 1 sccm | 1 sccm | | 10 w/cm² | 130° C. | 0.3 Pa | 50 mm |
| Example 3 | 40 sccm | 5 sccm | | 1 sccm | 10 w/cm² | 130° C. | 0.4 Pa | 50 mm |
| Example 4 | 50 sccm | | 10 sccm | 3 sccm | 10 w/cm² | 130° C. | 0.5 Pa | 50 mm |

TABLE 5

|  | Film thickness | Refractive index 248 nm | Refractive index 193 nm | Transmittance 248 nm | Transmittance 193 nm |
|---|---|---|---|---|---|
| Example 2 | 849 Å | 2.46 | 2.23 | 12% | 5% |
| Example 3 | 805 Å | 2.55 | 2.28 | 5% | 3% |
| Example 4 | 940 Å | 2.32 | 2.14 | 23% | 8% |

There has been described a high precision phase shift mask having a homogeneous shifter film which has been formed under the sputtering conditions capable of restraining the generation of particles causing film defects.

Japanese Patent Application No. 11-139597 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A phase shift mask comprising a phase shifter serving as a second light transmissive region formed on a substrate which is transmissive to exposure light, said phase shifter being constructed of gadolinium gallium garnet.

2. The phase shift mask of claim 1 wherein said phase shifter shifts the phase of transmitted exposure light by 180±5° and has a transmittance of 3 to 30%.

3. The phase shift mask of claim 1 wherein said gadolinium gallium garnet film shifts the phase of transmitted exposure light by 180±5° and has a transmittance of 3 to 30%.

4. The phase shift mask of claim 1, wherein the substrate is quartz or $CF_2$.

5. The phase shift massk of claim 1, wherein the phase shifter has a transmittance to light at 248 nm, 193 nm or 157 nm.

6. The phase mask of claim 1, wherein the phase shifter has a film thickness of 805 to 904 Å.

7. A process for preparing a phase shift mask comprising the steps of:

forming a film of gadolinium gallium garnet on a substrate which is transmissive to exposure light, by sputtering, forming a resist pattern on the gadolinium gallium garnet film, and dry etching the gadolinium gallium garnet film through the resist pattern to pattern the gadolinium gallium garnet film.

8. The process of claim 7 wherein the sputtering step uses an oxide single crystal of gadolinium gallium garnet as the target.

9. The process of claim 7 wherein the sputtering step is reactive sputtering using a mixture of an inert gas with an element source gas selected from among oxygen, nitrogen and carbon.

10. The process of claim 9 wherein the element source gas is selected so as to provide a flow rate of 1 to 25% of oxygen, 2 to 20% of nitrogen or 2 to 15% of carbon, based on the flow rate of the inert gas.

11. The process of claim 9, wherein the element source gas is selected such that the phase shifter has a refractive index in the range from 2.0 to 2.6.

12. The process of claim 7, wherein the sputtering step is conducted by magnetron sputtering.

13. The process of claim 7, wherein the sputtering step is conducted by RF magnetron sputtering.

* * * * *